US012587150B2

(12) United States Patent
Poulin

(10) Patent No.: US 12,587,150 B2
(45) Date of Patent: Mar. 24, 2026

(54) POWER AMPLIFIER LINEARITY CONTROL BASED ON POWER AMPLIFIER OPERATING MODE OR POWER LEVEL

(71) Applicant: Skyworks Solutions, Inc., Irvine, CA (US)

(72) Inventor: Grant Darcy Poulin, Carp (CA)

(73) Assignee: Skyworks Solutions, Inc., Irvine, CA (US)

( * ) Notice: Subject to any disclaimer, the term of this patent is extended or adjusted under 35 U.S.C. 154(b) by 659 days.

(21) Appl. No.: 17/959,136

(22) Filed: Oct. 3, 2022

(65) Prior Publication Data

US 2023/0126040 A1 Apr. 27, 2023

Related U.S. Application Data

(60) Provisional application No. 63/252,034, filed on Oct. 4, 2021.

(51) Int. Cl.
| | |
|---|---|
| *H03F 3/24* | (2006.01) |
| *H03F 1/32* | (2006.01) |
| *H03F 3/195* | (2006.01) |
| *H04B 1/04* | (2006.01) |

(52) U.S. Cl.
CPC ........... *H03F 3/245* (2013.01); *H03F 1/3241* (2013.01); *H03F 3/195* (2013.01); *H04B 1/0475* (2013.01); *H03F 2200/451* (2013.01); *H04B 2001/0425* (2013.01)

(58) Field of Classification Search
CPC ........ H03F 3/245; H03F 1/3241; H03F 3/195; H03F 2200/451; H03F 1/0227; H03F 1/3247; H03F 3/19; H04B 1/0475; H04B 2001/0425; H04B 2001/0408
USPC .......................................................... 330/296
See application file for complete search history.

(56) References Cited

U.S. PATENT DOCUMENTS

| | | | |
|---|---|---|---|
| 6,445,251 | B1 | 9/2002 | Robinson |
| 6,670,849 | B1 | 12/2003 | Damgaard et al. |
| 6,950,636 | B2 | 9/2005 | Rozenblit et al. |
| 7,262,657 | B2 | 8/2007 | Nellis et al. |
| 7,276,973 | B2 | 10/2007 | Ripley et al. |
| 7,414,479 | B2 | 8/2008 | Ripley et al. |
| 7,605,651 | B2 | 10/2009 | Ripley et al. |
| 8,319,557 | B2 | 11/2012 | Prikhodko et al. |
| 8,369,805 | B2 | 2/2013 | Homol et al. |
| 8,421,539 | B2 | 4/2013 | Zhang et al. |
| 8,598,951 | B1 | 12/2013 | Hau |
| 9,048,802 | B2 | 6/2015 | Firouzkouhi et al. |
| 9,407,215 | B2 | 8/2016 | Gill et al. |
| 9,467,101 | B2 | 10/2016 | Ni |
| 9,467,940 | B2 | 10/2016 | Zhang et al. |
| 9,473,076 | B2 | 10/2016 | Ni et al. |
| 9,806,679 | B2 | 10/2017 | Gorbachov et al. |
| 9,813,029 | B2 | 11/2017 | Zhu et al. |
| 9,853,610 | B2 | 12/2017 | Lizarraga et al. |
| 9,882,538 | B2 | 1/2018 | Poulin et al. |

(Continued)

*Primary Examiner* — Andrea Lindgren Baltzell
*Assistant Examiner* — Jose E Pinero
(74) *Attorney, Agent, or Firm* — Knobbe, Martens, Olson & Bear, LLP

(57) ABSTRACT

Radio frequency systems and methods adjust power amplifier operation based on power amplifier operating mode or power level to achieve a tradeoff between improved linearity at lower power levels and improved out of band noise performance and coexistence at higher power levels.

20 Claims, 16 Drawing Sheets

(56)  References Cited

U.S. PATENT DOCUMENTS

| | | |
|---|---|---|
| 9,912,298 B2 | 3/2018 | Lyalin et al. |
| 10,211,862 B2 | 2/2019 | Poulin |
| 10,365,308 B2 | 7/2019 | Zhang |
| 10,381,990 B2 | 8/2019 | Allen |
| 10,574,191 B2 | 2/2020 | Zhu |
| 10,574,192 B2 | 2/2020 | Zhu et al. |
| 10,812,026 B2 | 10/2020 | Zhu et al. |
| 10,812,030 B2 | 10/2020 | Ye et al. |
| 11,038,465 B2 | 6/2021 | Hageraats et al. |
| 11,290,072 B2 | 3/2022 | Poulin et al. |
| 11,621,676 B2 | 4/2023 | Cook et al. |
| 2017/0005624 A1 | 1/2017 | Zhu et al. |
| 2017/0005626 A1 | 1/2017 | Zhu et al. |
| 2017/0026000 A1 | 1/2017 | Ni |
| 2020/0021257 A1 | 1/2020 | Poulin et al. |
| 2023/0020495 A1* | 1/2023 | Lehtola ................... H03F 3/245 |
| 2023/0126040 A1 | 4/2023 | Poulin |
| 2023/0223964 A1 | 7/2023 | Poulin et al. |
| 2023/0223965 A1 | 7/2023 | Poulin et al. |
| 2024/0056035 A1 | 2/2024 | Zhu et al. |
| 2025/0062725 A1 | 2/2025 | Zhu et al. |

* cited by examiner

_10

RF_IN                PAM                RF_OUT

11~

WIRELESS DEVICE

21~

BATTERY        17~        PROCESSOR        COMPUTER READABLE MEDIUM

PA        ~20        ~19

CONTROL        _18

15~        Tx PATH(S)

PA        •••

13        12        14

TRANSCEIVER        SWITCHES        ANTENNA

16~        •••

Rx PATH(S)

OOBE VS OFFSET FROM BAND EDGE FOR 160MHz 11ax WAVEFORM.
Psat=31.2dBm. Pout=26dBm OOBE VS OFFSET FROM BAND EDGE FOR 160MHz 11ax WAVEFORM.
Psat=31.2dBm. Pout=22dBm

PREAMPLIFIER DISTORTION COMPRESSION CURVE

OUTPUT POWER

GAIN (dB)

POWER AMPLIFIER LINEARITY CONTROL BASED ON POWER AMPLIFIER OPERATING MODE OR POWER LEVEL

INCORPORATION BY REFERENCE TO ANY PRIORITY APPLICATIONS

Any applications for which a foreign or domestic priority claim is identified in the Application Data Sheet as filed with the present application are hereby incorporated by reference under 37 CFR 1.57.

BACKGROUND

Field

Embodiments of the invention relate to electronic systems and, in particular, to radio frequency electronics.

Description of the Related Technology

Radio frequency (RF) power amplifiers can be used to boost the power of a RF signal having a relatively low power. Thereafter, the boosted RF signal can be used for a variety of purposes, including driving the antenna of a transmitter.

Power amplifiers can be included in mobile phones to amplify an RF signal for transmission. For example, in mobile phones that communicate using a wireless local area network (WLAN) protocol and/or any other suitable communication standard, a power amplifier can be used to amplify the RF signal. Amplifying the RF signal to an incorrect power level or introducing significant distortion of the original RF signal can cause a wireless device to transmit out of band or violate compliance with accepted standards. Biasing a power amplifier device can determine the voltage and/or current operating point of the amplifying devices within the power amplifier.

SUMMARY

In some aspects, the techniques described herein relate to a power amplifier system including: a power amplifier configured to amplify a radio frequency transmit signal for transmission via a first antenna; and a controller configured to control the power amplifier based on one or both of an operating mode of the power amplifier and a power level of the power amplifier, to operate according to a first output profile at a first power level, and to operate according to a second output profile at a second power level, the first power level lower than the second power level, and the first output profile corresponding to higher linearity than the second output profile.

In some aspects, the techniques described herein relate to a power amplifier system wherein the controller is configured to adjust a bias of the power amplifier to cause the power amplifier to switch between operating according to the first and second output profiles.

In some aspects, the techniques described herein relate to a power amplifier system wherein the controller is configured to adjust a pre-distortion to cause the power amplifier to switch between operating according to the first and second output profiles.

In some aspects, the techniques described herein relate to a power amplifier system further including a digital-predistortion module residing on a processor, the controller configured to control the pre-distortion module to adjust the pre-distortion.

In some aspects, the techniques described herein relate to a power amplifier system wherein the controller is configured to control the power amplifier to operate according to the first output profile in response to the power amplifier operating in a first lower power operating mode and to operate according to the second output profile in response to the power amplifier operating in a second higher power operating mode.

In some aspects, the techniques described herein relate to a power amplifier wherein the controller is configured to determine an operating mode or power level of the power amplifier during a pre-determined period corresponding to transmission of one or more training symbols defined by a wireless communication standard.

In some aspects, the techniques described herein relate to a power amplifier system wherein the first output profile corresponds to a first Rapp model "P" value, and the second output profile corresponds to a second Rapp model "P" value lower than the first Rapp model "P" value.

In some aspects, the techniques described herein relate to a power amplifier system further including a gain compression circuit configured to apply increasing distortion to the power amplifier with increasing power amplifier output power.

In some aspects, the techniques described herein relate to a power amplifier system further including a detector configured to detect a power level of the power amplifier.

In some aspects, the techniques described herein relate to an access point, base station, or mobile device including the power amplifier system.

In some aspects, the techniques described herein relate to a radio frequency system including: a power amplifier configured to amplify a radio frequency transmit signal for transmission via a first antenna; a controller configured to control the power amplifier based on one or both of an operating mode of the power amplifier and a power level of the power amplifier, to operate according to a first output profile at a first power level, and to operate according to a second output profile at a second power level, the first power level lower than the second power level, and the first output profile corresponding to higher linearity than the second output profile; and a baseband processor.

In some aspects, the techniques described herein relate to a radio frequency system wherein the controller is configured to adjust a bias of the power amplifier to cause the power amplifier to switch between operating according to the first and second output profiles.

In some aspects, the techniques described herein relate to a radio frequency system wherein the controller is configured to adjust a pre-distortion to cause the power amplifier to switch between operating according to the first and second output profiles.

In some aspects, the techniques described herein relate to a power amplifier system further including a digital-pre-distortion module residing on a processor, the controller configured to control the pre-distortion module to adjust the pre-distortion.

In some aspects, the techniques described herein relate to a radio frequency system wherein the controller is configured to control the power amplifier to operate according to the first output profile in response to the power amplifier operating in a first lower power operating mode and to operate according to the second output profile in response to the power amplifier operating in a second higher power operating mode.

In some aspects, the techniques described herein relate to a radio frequency system wherein the controller is configured to determine an operating mode or power level of the power amplifier during a pre-determined period corresponding to transmission of one or more training symbols defined by a wireless communication standard.

In some aspects, the techniques described herein relate to a radio frequency system wherein the first output profile corresponds to a first Rapp model "P" value, and the second output profile corresponds to a second Rapp model "P" value lower than the first Rapp model "P" value.

In some aspects, the techniques described herein relate to a radio frequency system further including a gain compression circuit configured to apply increasing distortion to the power amplifier with increasing power amplifier output power.

In some aspects, the techniques described herein relate to a radio frequency system wherein the baseband processor implements at least a portion of the controller.

In some aspects, the techniques described herein relate to a radio frequency system, including: a radio frequency receive path configured to operate on a radio frequency receive signal detected by a first antenna; and a radio frequency transmit path including a power amplifier configured to amplify a radio frequency transmit signal for transmission via a second antenna, and further including a gain compression circuit configured to apply increasing distortion to the power amplifier with increasing power amplifier output power.

BRIEF DESCRIPTION OF THE DRAWINGS

Embodiments of this disclosure will now be described, by way of non-limiting example, with reference to the accompanying drawings.

FIG. 9AA shows EVM versus output power for power amplifier configurations at different P values.

FIG. 9AB shows OOB noise versus frequency offset from band edge for power amplifier configurations at different P values, at a first output power level.

FIG. 9AC shows OOB noise versus frequency offset from band edge for power amplifier configurations at different P values, at a second output power level.

FIG. 9AD shows EVM versus output power for a power amplifier configured at different P values for different power levels.

DETAILED DESCRIPTION OF EMBODIMENTS

Figures 1, 2:
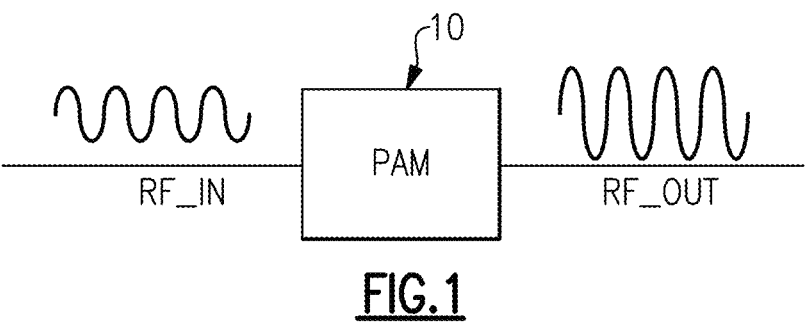
FIG. 1 is a schematic diagram of a power amplifier module for amplifying an RF signal.
FIG. 2 is a schematic block diagram of an example wireless device that can include one or more of the power amplifier modules of FIG. 1.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

As new technologies are developed and standards are established, including, e.g., new frequency bands being used for communication, the utilization of various bands get crowded. For example, the new 6-GHz band will lead to systems working with simultaneous transmission (Tx) and receiving (Rx) (STR) in the 5-GHz and 6-GHz bands. OOB noise from the 6 GHz Tx chain will show up as in-band noise in the 5 GHz receiver, degrading Rx sensitivity. Thus, certain embodiments can apply a combination of filtering, antenna isolation, and low noise PAs to reduce de-sense. Since the radios may be co-located in a same RF system (e.g., an access point, base station, or smartphone or other user device), the noise from a transmitter in one band can couple directly to a receiver in another band, which results in sensitivity degradation, and moreover degradation in throughput and range which impacts end user experience.

FIG. 1 is a schematic diagram of a power amplifier module 10 for amplifying a radio frequency (RF) signal. The illustrated power amplifier module (PAM) 10 is configured to amplify an RF signal RF_IN to generate an amplified RF signal RF_OUT. As described herein, the power amplifier module 10 can include one or more power amplifiers, including, for example, multi-stage power amplifiers.

FIG. 2 is a schematic block diagram of an example wireless device 11 that can include one or more of the power amplifier modules of FIG. 1. The wireless device 11 can include a power amplifier bias circuit implementing one or more features of the present disclosure in a control component 18. The power amplifier bias circuit can include a control circuit and a primary biasing circuit. More details regarding embodiments of these circuits will be provided later, for example, with reference to FIGS. 9A-9F.

The example wireless device 11 depicted in FIG. 2 can represent a multi-band and/or multi-mode device such as a multi-band/multi-mode mobile phone. In certain embodiments, the wireless device 11 can include a switch module 12, a transceiver 13, an antenna 14, power amplifiers 17, a control component 18, a computer readable medium 19, a processor 20, and a battery 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15, the wireless device 11 can include more or fewer transmission paths 15.

The power amplifiers 17 can be used to amplify a wide variety of RF signals. For example, one or more of the power amplifiers 17 can receive an enable signal that can be used to pulse the output of the power amplifier to aid in transmitting a wireless local area network (WLAN) signal, such as a WLAN 802.11ax signal, or any other suitable pulsed signal. In certain embodiments, one or more of the power amplifiers 17 are configured to amplify a Wi-Fi signal. Each of the power amplifiers 17 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an 5G signal.

One or more features of the present disclosure can be implemented in the foregoing example communication standards, modes and/or bands, and in other communication standards.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16.

To facilitate switching between receive and transmit paths, the switch module 12 can be configured to electrically connect the antenna 14 to a selected transmit or receive path. Thus, the switch module 12 can provide a number of switching functionalities associated with an operation of the wireless device 11. In certain embodiments, the switch module 12 can include a number of switches configured to provide functionalities associated with, for example, switching between different bands, switching between different power modes, switching between transmission and receiving modes, or some combination thereof. The switch module 12 can also be configured to provide additional functionality, including filtering and/or duplexing of signals.

FIG. 2 shows that in certain embodiments, a control component 18 can be provided for controlling various control functionalities associated with operations of the switch module 12, the power amplifiers 17, and/or other operating component(s). The control component 18 can be implemented on the same die as the power amplifier 17 in certain implementations. The control component 18 can be implemented on a different die than the power amplifier 17 in some implementations. Non-limiting examples of the control component 18 that include a control circuit and a bias circuit to achieve a desired balance of EVM reduction and OOB emissions are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide instructions for implementing the acts specified in the flowchart and/or block diagram block or blocks.

The battery 21 can be any suitable battery for use in the wireless device 11, including, for example, a lithium-ion battery.

Figure 3:
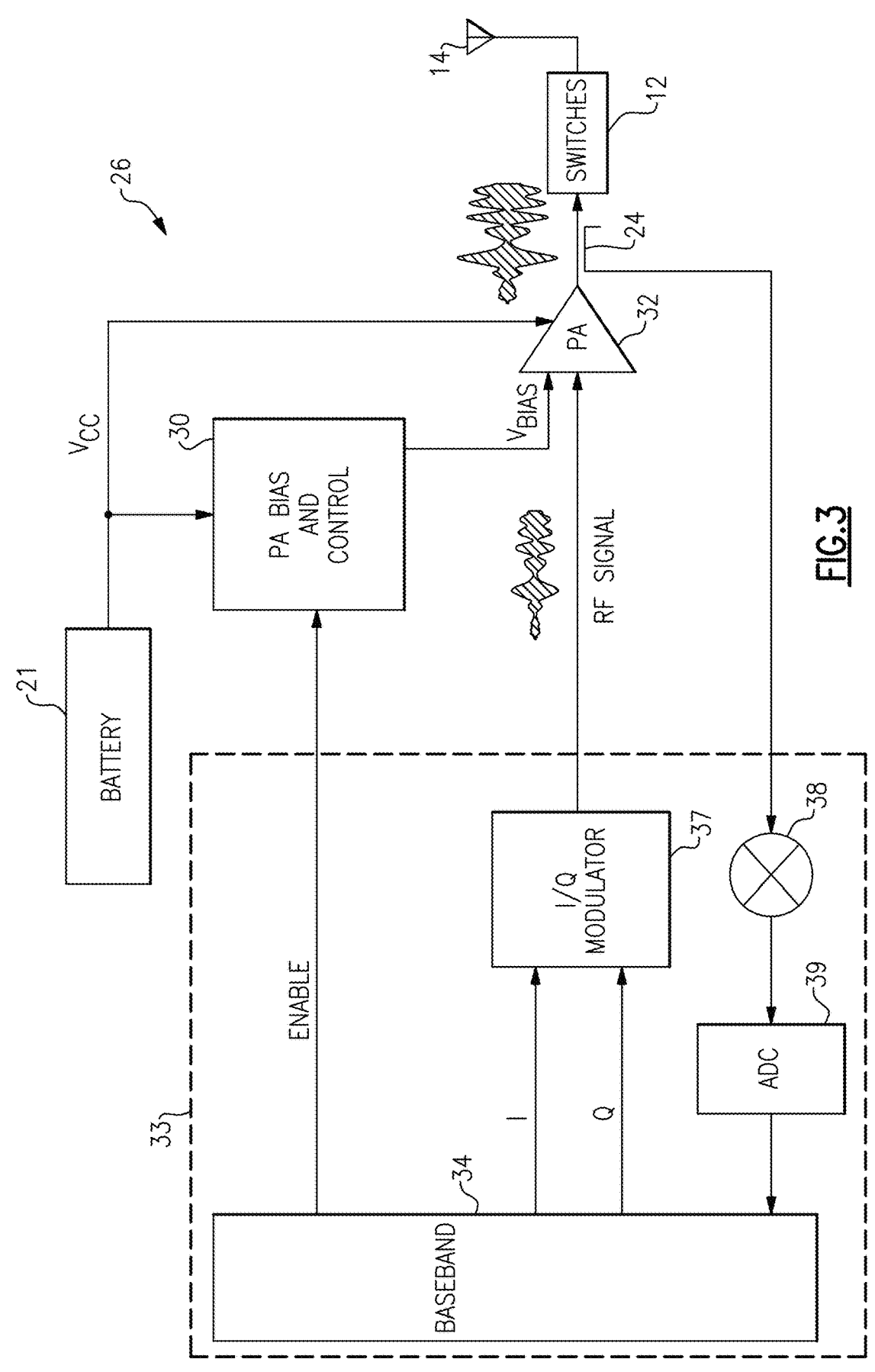
FIG. 3 is a schematic block diagram of one example of a power amplifier system.

FIG. 3 is a schematic block diagram of one example of a power amplifier system 26. The illustrated power amplifier system 26 includes the switch module 12, the antenna 14, the battery 21, a directional coupler 24, a power amplifier bias and control circuit 30, a power amplifier 32, and a transceiver 33. The illustrated transceiver 33 includes a baseband processor 34, an I/Q modulator 37, a mixer 38, and an analog-to-digital converter (ADC) 39.

The baseband signal processor 34 can generate an I signal and a Q signal, which can be used to represent a sinusoidal wave or signal of a desired amplitude, frequency, and phase. For example, the I signal can represent an in-phase component of the sinusoidal wave and the Q signal can represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate a RF signal. For example, the I/Q modulator 37 can include digital-to-analog converters (DACs) configured to convert the I and Q signals into an analog format, mixers for upconverting the I and Q signals to radio frequency, and a signal combiner for combining the upconverted I and Q signals into a RF signal suitable for amplification by the power amplifier 32. In certain implementations, the I/Q modulator 37 can include one or more filters configured to filter frequency content of signals processed therein.

The power amplifier bias and control circuit 30 can receive an enable signal ENABLE from the baseband processor 34 and a battery or power high voltage $V_{CC}$ from the battery 21, and can generate a bias voltage VBIAS for the power amplifier 32 based on the enable signal ENABLE. The power amplifier bias and control circuit 30 can also include circuitry configured to perform optimization of EVM and OOB emissions as will be discussed in more detail later. Although FIG. 3 illustrates the battery 21 directly generating the power high voltage $V_{CC}$, in certain implementations the power high voltage $V_{CC}$ can be a regulated voltage generated by a regulator that is electrically powered using the battery 21. The power amplifier 32 can receive the RF signal from the I/Q modulator 37 of the transceiver 33, and can provide an amplified RF signal to the antenna 14 through the switch module 12.

The directional coupler 24 can be positioned between the output of the power amplifier 32 and the input of the switch module 12, thereby allowing an output power measurement of the power amplifier 32 that does not include insertion loss of the switch module 12. The sensed output signal from the directional coupler 24 can be provided to the mixer 38, which can multiply the sensed output signal by a reference signal of a controlled frequency so as to downshift the frequency content of the sensed output signal to generate a downshifted signal. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 26. For example, configuring the power amplifier system 26 in this manner can aid in controlling the power added efficiency (PAE) and/or linearity of the power amplifier 32.

Figure 4:
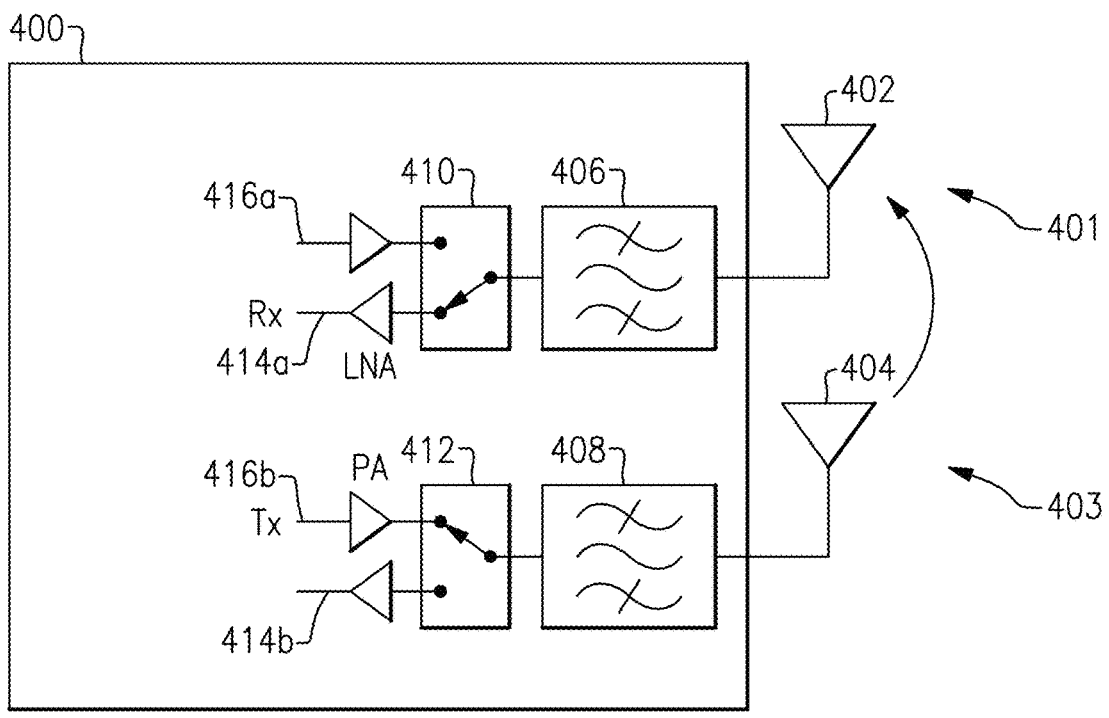
FIG. 4 is a schematic representation of an example RF front end system configured for simultaneous transmission and receive in multiple frequency bands.
Figure 5:
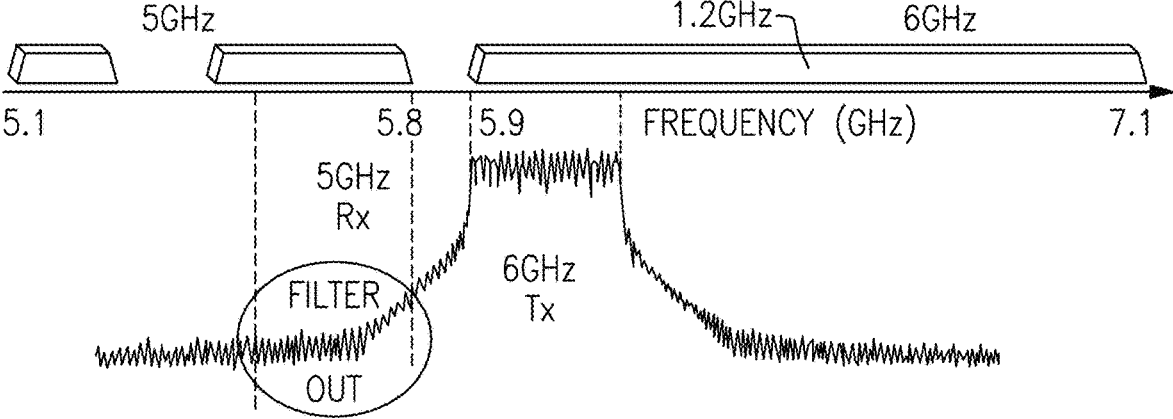
FIG. 5 shows an example of 5-GHz and 6-GHz frequency bands wherein out-of-band (OOB) noise is observed.

FIG. 4 depicts an example RF front end system 400 including a first communication path 401 including one or more antennas 402, one or more band-pass filters 406, one or more switch modules 410, one or more low noise amplifiers 414a, and one or more power amplifiers 416a, and a second communication path 403 including one or more antennas 404, one or more band-pass filters 408, one or more switch modules 412, one or more low noise amplifiers 414b, and one or more power amplifiers 416b. The RF front end system 400 may work with simultaneous transmission (Tx) and receiving (Rx) (STR) in multiple frequency bands. While the RF front end system 400 as illustrated includes two antennas, two filters, and two switches, two power amplifiers, and two low noise receivers, for example, it would be appreciated by one of ordinary skill in the art that the number of the components can vary, as described herein. In certain embodiments, the RF front end system 400 can be an access point (AP), base station, or user equipment such as a smartphone. In certain embodiments, the RF front end system 400 can include more than one communication path (e.g., two or more), wherein the communication paths can be related to same or different bands, for example. As illustrated, an example RF front end system 400 may transmit and receive signals simultaneously in 5-GHz and 6-GHz bands in certain embodiments. One of ordinary skill in the art would recognize that the bands with which an embodiment of the RF front end system 400 can work are not limited to the 5-GHz and 6-GHz bands. Rather, the bands may be any combination of bands that can create a problem related to signal isolation in some examples, as described herein. In one embodiment, the communication path of a 5-GHz band can include the antenna 402, the filter 406, the switch module 410, the LNA 414a for receiving signals, and PA 416a for transmitting signals. The communication path of a 6-GHz band can include the antenna 404, filter 408, the switch module 412, the LNA 414b for receiving signals, and the PA 416b for transmitting signals. As discussed herein, the OOB noise from, e.g., the 6-GHz Tx chain may show up as in-band noise in the 5-GHz receiver and reduce the Rx sensitivity. For example, the RF front end system 400 may amplify a signal to be transmitted in a 6-GHz band via the PA 416b, which can be switched on via the switch module 412 for transmission, pass through the filter 408, and be transmitted via the antenna 404. However, there may be a possibility that the signal (e.g., at a band edge) may be detected by the antenna 402 (e.g., of a Rx path). As but one example, FIG. 5 shows an example of 5-GHz and 6-GHz frequency bands wherein out-of-band (OOB) noise can be observed. That is, because the 5-GHz and 6-GHz bands are relatively close to each other in the frequency spectrum, the OOB noise from the 6-GHz Tx chain may show up as in-band noise in the 5-GHz Rx chain. For example, the OOB noise from the 6-GHz Tx chain can be detected by the antenna 402, pass through the filter 406 and the switching module 410, and be amplified for processing by the LNA 414a.

As discussed herein, one way to address the aforementioned problem associated with STR for a multi-band operation (e.g., a dual-band operation with the 5/6-GHz bands) may be with filtering. For example, bulk acoustic wave (BAW) filters with steep skirts can be deployed on the output of the PA 414b to filter out the noise before it couples to the receiver. This technique works well, but BAW filters are large, lossy, and expensive. In addition, as soon as a BAW filter is added to a transmitter, the frequency range over which the PA can be used is fixed to some extend by the hardware, so BAW filters can reduce flexibility to dynamically allocate channels across different bands.

A second technique which can be used is to use antennas with high isolation, as this will reduce the amount of power that couples from the transmitter to the "victim" receiver. This technique must be combined with channel separation (guard bands), taking advantage of the fact that OOB emissions are reduced as channels are separated. In certain examples, channels may need to be separated by 500 MHz or more if an antenna configuration with, e.g., 40 dB antenna isolation is used. But these large guard bands can significantly reduce the suable spectrum, ultimately reducing throughput. In addition, channel bandwidths may be reduced, since emissions from, e.g., 20 MHz channels are lower than emissions from, e.g., 160 MHz channels. This may also reduce the available throughput.

Power amplifier systems described herein address these and other challenges, and provide reduced out of band emissions while preserving sufficient linearity by adjusting the linearity of the power amplifier system, e.g., based on a power amplifier operating mode or power level.

Figure 6:
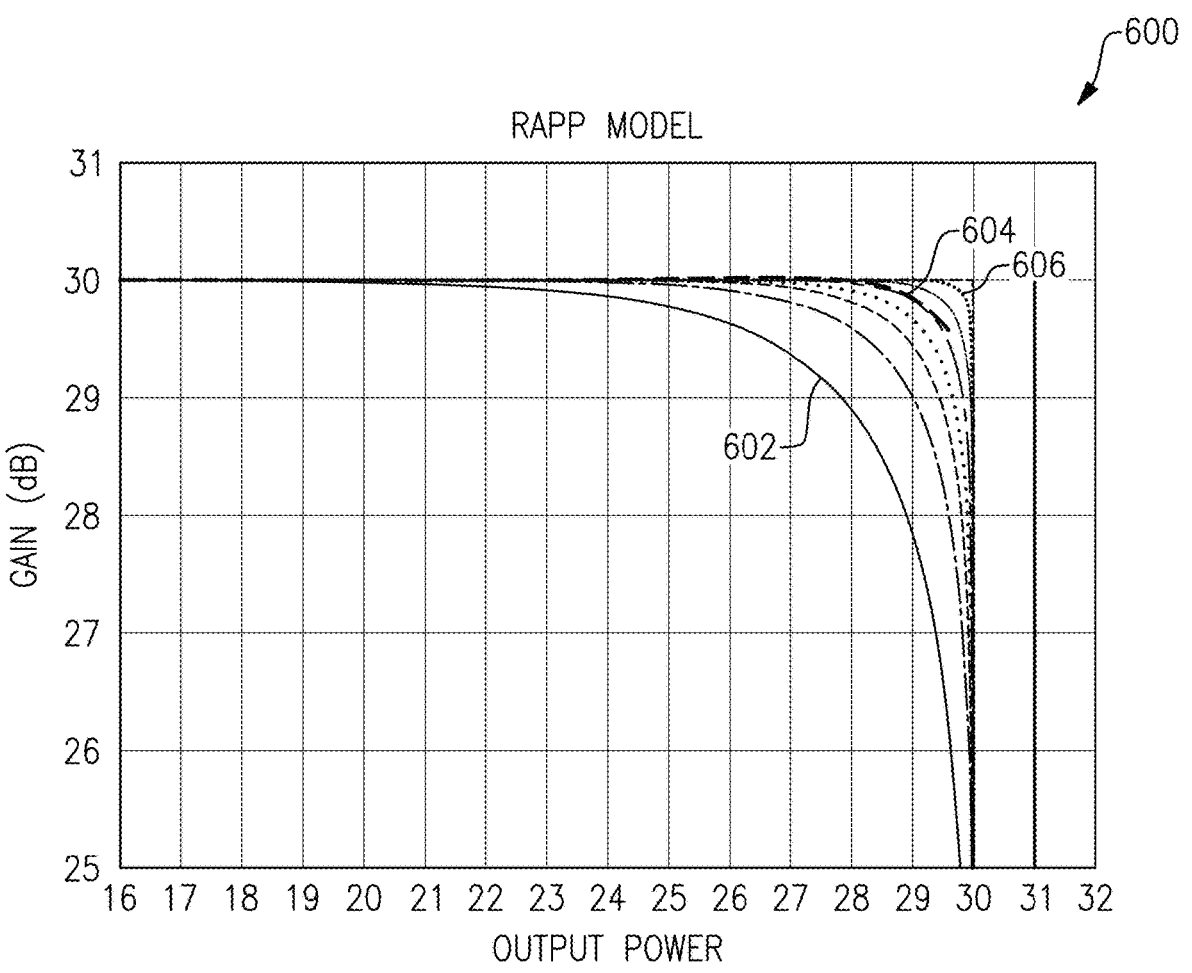
FIG. 6 is a graph showing examples of gain compression curves for various "P" parameter values of the Rapp model.

The Rapp model is a behavioral amplifier model which can characterize AM/AM conversion of a solid-state high power amplifier. The Rapp model represents only AM/AM distortion, and distortion is controlled with only a single parameter, "P". FIG. 6 is a graph 600 of examples of simulated gain compression curves related to a simulated PA behavior for various distortion levels/P values of the Rapp model. Simulations may be performed by using a tool such as MATLAB. For example, P=2 for curve 602, P=6.5 for curve 604, and P=100 for curve 606. As illustrated, the curve 602 (P=2) indicates a relatively early and significant compression in gain. The curve 604 (P=6.5) may be representative of a typical linear PA, while the curve 606 (P=100) is illustrating a highly linear PA (e.g., perfectly or near-perfectly linear). From the graph 600, it can be seen that at higher output power levels, the variance in the gain compression is higher for different levels of linearity/different P values than at lower output power levels.

Figure 7:
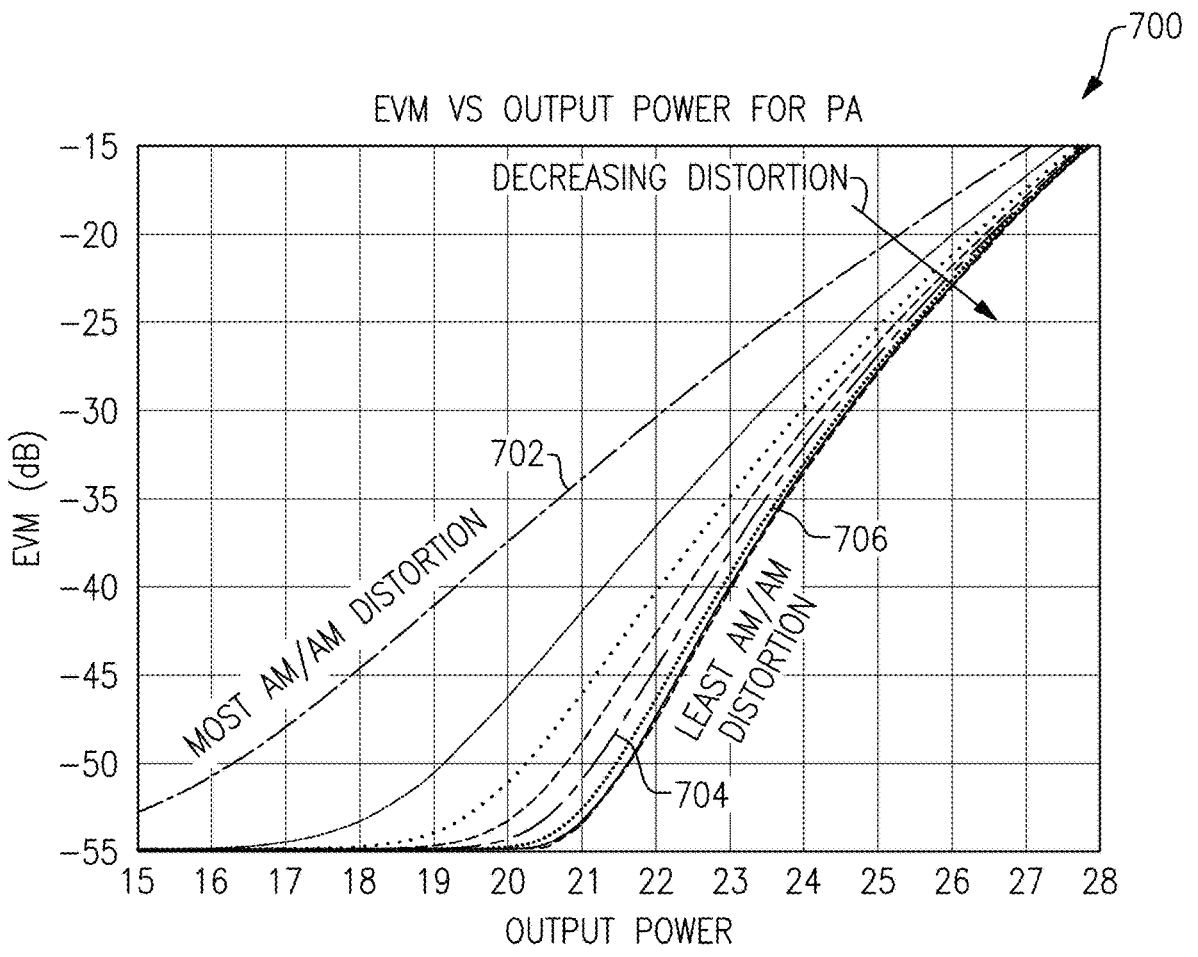
FIG. 7 is a graph showing examples of error vector magnitude (EVM) curves for various "P" parameter values of the Rapp model.

FIG. 7 is a graph 700 of examples of error vector magnitude (EVM) curves related to a simulated PA behavior for the various P parameter values of the Rapp model. Similar to above, the simulations may be performed via, e.g., MATLAB for EVM versus output power of a RF system. It can be seen that the EVM is significantly degraded when amplified by a PA with significant AM/AM distortion, as shown in curve 702 (P=2), while EVM performance improves for lower AM/AM distortion/higher P values, such as is illustrated in curve 704 (P=6.5) and curve 706 (P=100).

Figure 8:
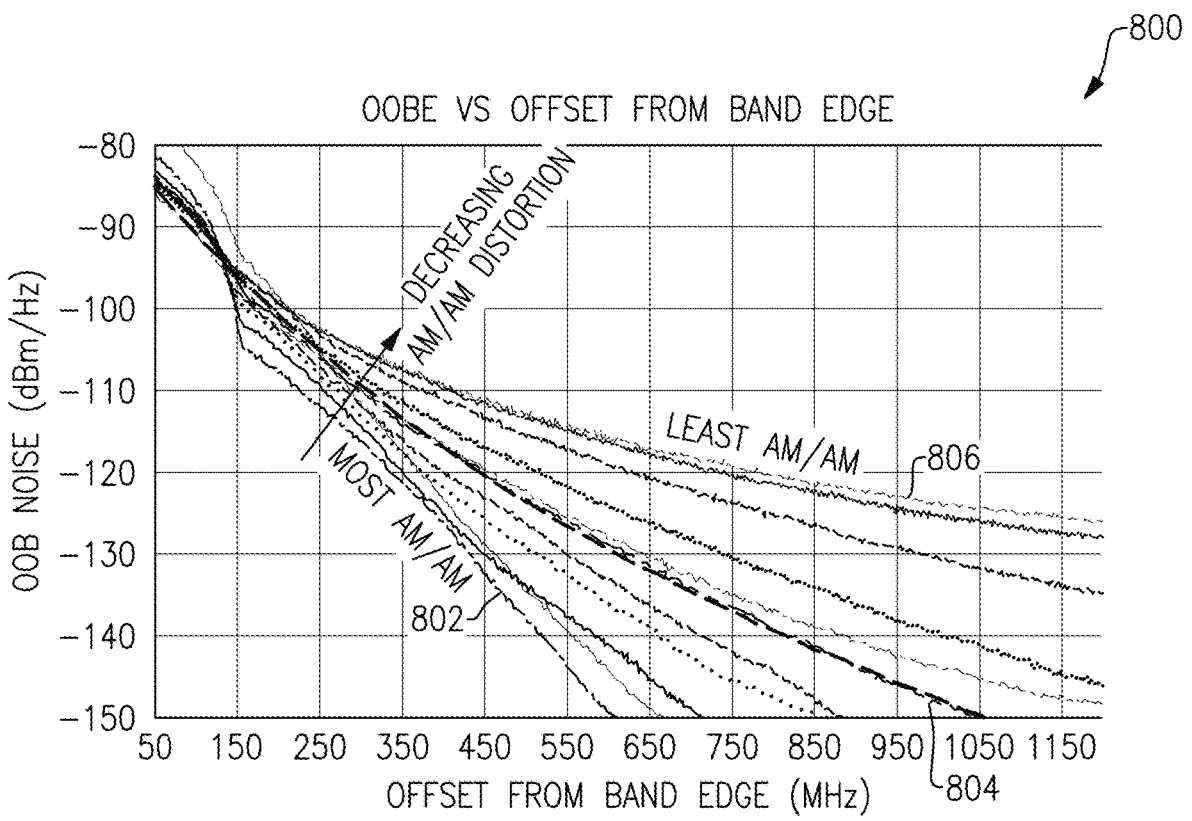
FIG. 8 is a graph of examples of OOB noise curves for various "P" parameter values of Rapp model.

FIG. 8 is a graph 800 of examples of OOB noise curves for the various P parameter values of Rapp model. In addition to the observations made with the simulations described above, it may be observed that there is an inverse relationship between linearity and OOB noise, especially beyond around 160 MHz offset from band edge.

In FIG. 8, it can be observed that a device with P=2 (curve 802) may have OOB emissions 15 dB lower than a more linear PA with P=6.5 (curve 804) at around 480 MHz offset (with OOB emission near −140 dBm/Hz). In contrast, the OOB emission at −140 dBm/MHz with P=2 may be achieved at an offset 300 MHz closer to the band edge, when compared to the case where P=6.5. The curve 806 represents the OOB emission characteristic simulated for P=100 (e.g., perfectly linear PA). As shown, the OOB performance is significantly worse than for lower linearity P values.

Based on the observations described above, it can be seen that when a PA is operating at high powers, EVM is of less importance, as there is typically an EVM margin without a significant loss thereof when the power level of the PA is close to a mask-limited power. Thus, at high powers, one can improve the OOB emission level to improve co-existence with multiple (e.g., two) bands, even at the expense of some EVM. On the other hand, when the PA is operating at lower powers to achieve a particular level of performance (e.g., an MCS11 operation), EVM is relatively more important, and the OOB noise is not as strong, due to, e.g., PA backoff (that is, e.g., an Rx chain of a dual-band RF system may be less sensitive to any OOB emissions from the signal transmitted via the Tx chain of the RF system, because the OOB emissions are lower, and will therefore have less of an impact on the Rx chain). Accordingly, one way embodiments described herein address the aforementioned problem associated with STR for the dual-band operation (e.g., for the 5/6-GHz bands) can be for the RF system to adjust the linearity of the power amplifiers, e.g., by adjusting bias or digital pre-distortion (DPD) to cause (i) more non-linearity correction and relatively lower AM/AM distortion (that is, relatively high linearity and improved EVM) at relatively lower output power levels (e.g., below one or more thresholds), and (ii) a reduced level of non-linearity correction (e.g., relatively lower linearity corresponding to higher AM/AM distortion and worse EVM) to allow the better OOB emission performance (e.g., relatively lower OOB emission with more EVM degradation but within increased margin), at relatively higher output power levels (e.g., above one or more thresholds).

FIGS. 9A, 9B, 9C, 9D, and 9E show various embodiments of power amplifier systems 60 configured to adjust power amplifier operation based on power amplifier operating mode or power level, e.g., to achieve a desirable tradeoff between linearity and OOB noise performance. For example, the power amplifier systems 60 can be configured to operate with relatively higher linearity at lower power modes/levels, where EVM is more important due to lower output power. Conversely, the power amplifier systems 60 can be configured to operate with relatively lower linearity at higher power modes/levels, where EVM is less important due to higher output power, and where the reduced linearity improves OOB noise. While FIGS. 9A, 9B, 9C, 9D, and 9E show only one transmit path for the purposes of illustration, it will be understood that the power amplifier system can be included in a RF front end system or other component that includes additional transmit and/or receive paths, such as the RF front end system 400 of FIG. 4 or the system 11 of FIG. 2. For example, the power amplifier systems 60 of FIGS. 9A, 9B, 9C, 9D, and 9E can be configured to transmit simultaneously while at least another coexisting receive path is receiving. The power amplifier systems 60 can be included in the second communication path 403 of the system 400 of FIG. 4, for example, and therefore comprise the power amplifier 416b and cause out of band noise emissions incident on the antenna 402 of the first communication path 401.

Figure 9A:
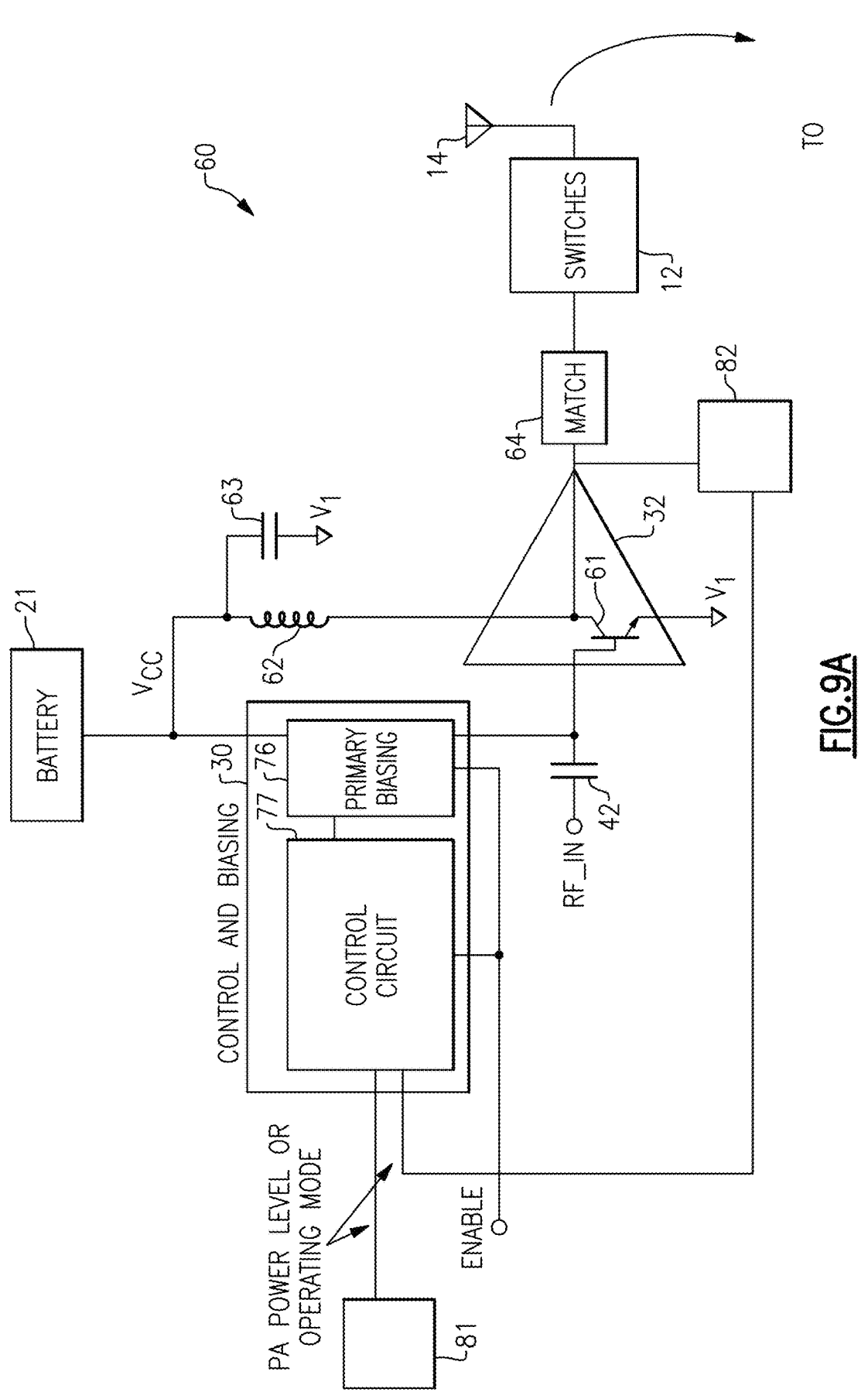
FIG. 9A is schematic block diagram of an example of a power amplifier system configured to adjust bias in response to a power amplifier operating mode or power level.
Figure 9A:
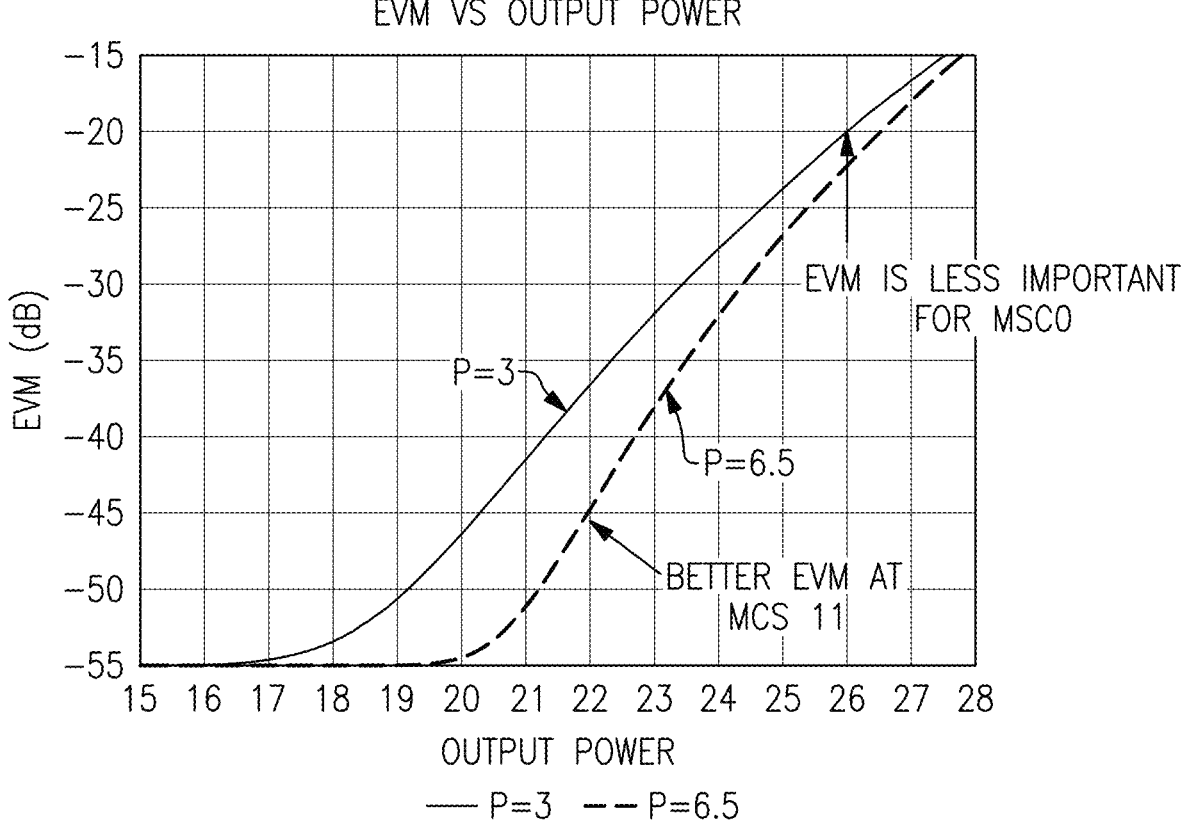
Figure 9A:
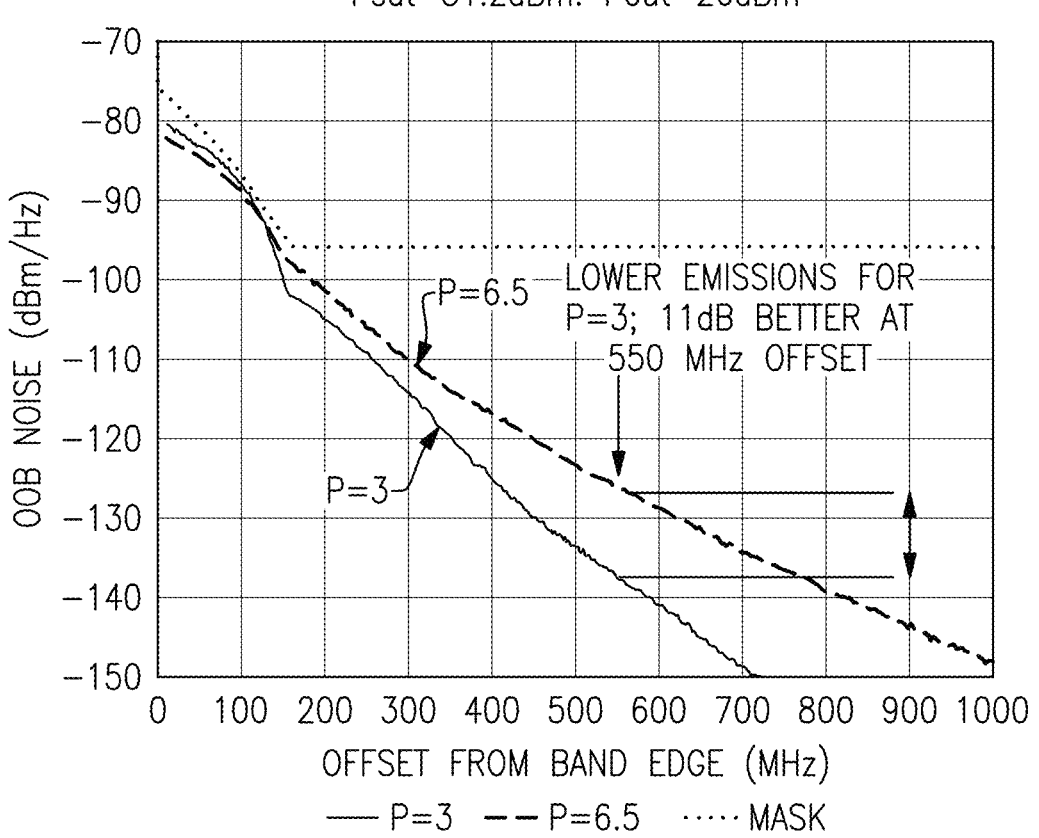
Figure 9A:
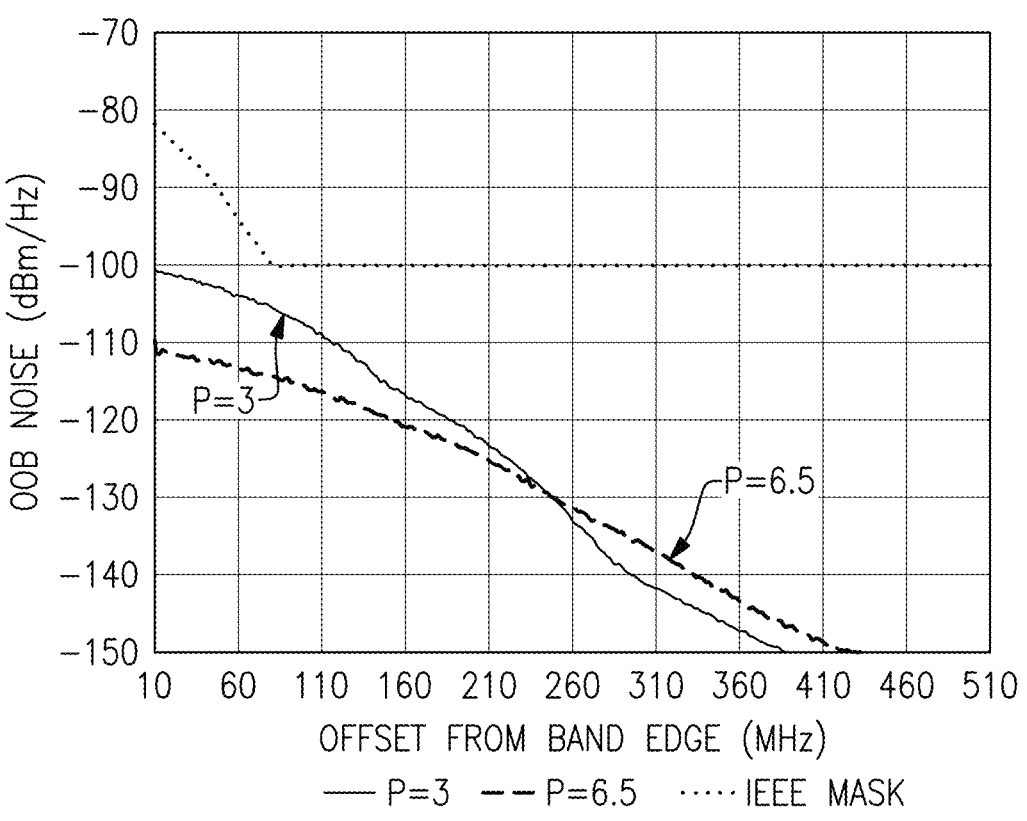
Figure 9A:
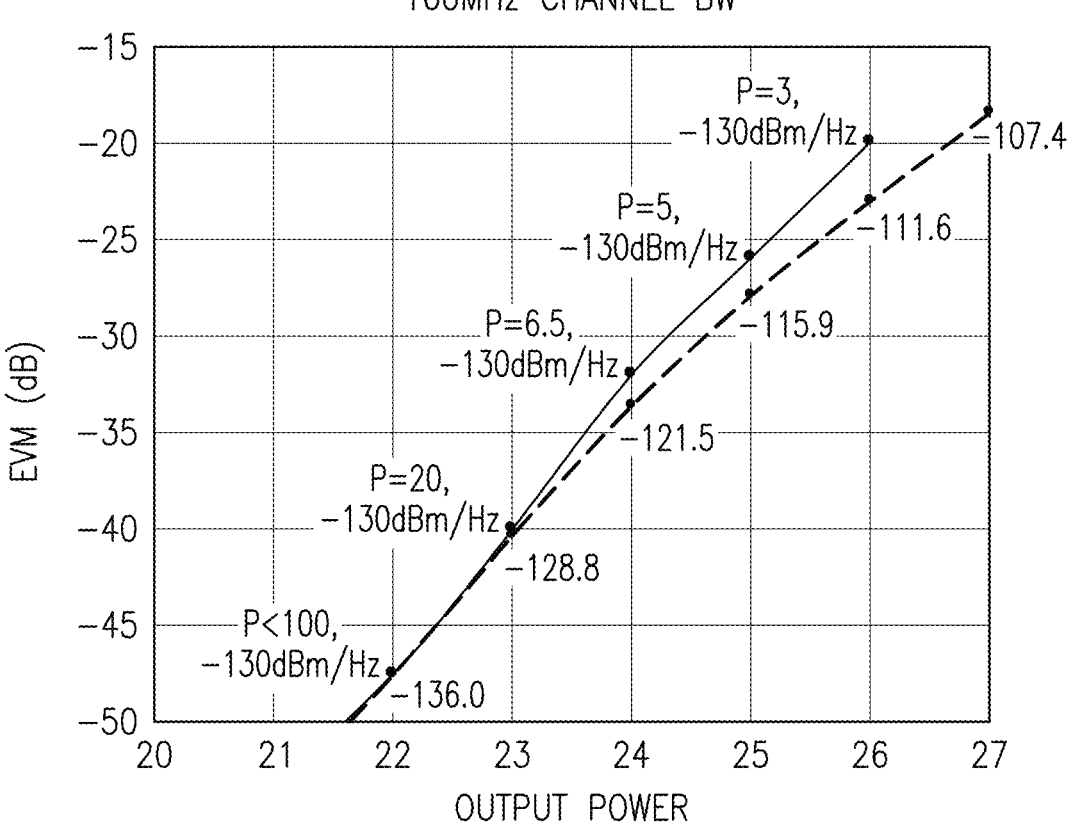

FIG. 9A is a schematic block diagram showing an example of a power amplifier system 60 configured to adjust power amplifier operation depending on a power level or operating mode of the power amplifier 32. The illustrated power amplifier system 60 includes a control and biasing circuit 30, a battery 21, a power amplifier 32, an inductor 62, a decoupling capacitor 63, an input capacitor 42, an impedance matching block 64, a switch module 12, and an antenna 14. As illustrated, the control and biasing circuit 30 includes a primary biasing circuit 76 and a control circuit 77. In certain embodiments, the power amplifier 32, the control circuit 77, and the primary biasing circuit 76 may be included within a single package. Although FIG. 9A illustrates one implementation of the power amplifier 32, it will be understood that the principles and advantages described herein can be implemented in connection with a variety of other power amplifier structures, including, for example, multi-stage power amplifier structures and/or power amplifiers employing other transistor structures. Furthermore, the principles and advantages discussed herein can be implemented in connection with any amplifier that can benefit from EVM and OOB tradeoff.

The illustrated power amplifier 32 includes a bipolar power amplifier transistor 61 having an emitter, a base, and a collector. The emitter of the bipolar power amplifier transistor 61 can be electrically connected to a first or power low voltage $V_1$, which can be, for example, a ground supply, and a radio frequency input signal RF_IN can be provided to the base of the bipolar power amplifier transistor 61 through the input capacitor 42. The bipolar power amplifier transistor 61 can amplify the RF input signal RF_IN and provide the amplified RF signal at the collector. The bipolar power amplifier transistor 61 can be any suitable device. In one implementation, the bipolar power amplifier transistor 61 is a heterojunction bipolar transistor (HBT).

The power amplifier 32 can be configured to provide the amplified RF signal to the switch module 12. The impedance matching block 64 can aid in terminating the electrical connection between the power amplifier 32 and the switch module 12. For example, the impedance matching block 64 can increase power transfer and/or reduce reflections of the amplified RF signal.

The inductor 62 can be included to aid in electrically powering the power amplifier 32 with the power high voltage $V_{CC}$ from the battery 21 while choking or blocking high frequency RF signal components. The inductor 62 can include a first end electrically connected to the power high voltage $V_{CC}$ and a second end electrically connected to the collector of the bipolar power amplifier transistor 61. As illustrated, the decoupling capacitor 63 is electrically connected between the power high voltage $V_{CC}$ and the power low voltage $V_1$ and can provide a low impedance path to high frequency signals, thereby reducing the noise of the power high voltage $V_{CC}$, improving power amplifier stability, and/or improving the performance of the inductor 62 as a RF choke.

The control and biasing circuit 30 can receive an enable signal for the power amplifier 32. The enable circuit can cause the control and biasing circuit 30 to turn the power amplifier 32 on and to turn the power amplifier 32 off depending on the state of the enable signal. For example, the enable signal can activate or deactivate the primary biasing circuit 76 responsive to a transition in the state of the enable signal. The enable signal can also be provided to the control circuit 77.

As shown, the control circuit 77 can receive one or more signals indicative of an output power level or power operating mode of the power amplifier 32 and/or of an operating mode of the power amplifier 32. For example, a detector 82 connected to the output of the power amplifier 32 can be configured detect a power level or operating mode of the power amplifier, and provide a first signal indicative of the power level or operating mode to the control circuit 77. The detector 82 can include a directional coupler, such as the directional coupler 24 described with respect to FIG. 3. In some embodiments, the detector 82 is an analog detector, and can include a diode-based detector, such as a diode rectifier or other appropriate analog detector. Depending on the embodiment, the detector 82 can operate in the digital domain and operate on a converted, downshifted signal, for example. For example, the detector can reside on the baseband processor 34, a processor of the power amplifier system 60, or some other appropriate component.

A control component 81, which, depending on the embodiment, can be implemented within the baseband processor or other component of a wireless device, can be configured to provide the control circuit 77 with a second signal indicating a power operating mode or detected or estimated power amplifier power level. For example, the control component 81 may reside on a packaged integrated circuit including one or more processors (e.g., a System-on-Chip [SoC]).

Based on the first or second signal, the control circuit 77 can cause the primary biasing circuit 76 to output a prescribed level of bias. The prescribed bias configures the power amplifier 32 such that it operates with a desired amount of AM/AM distortion correction, e.g., to provide relatively more distortion correction (better EVM operation and more linearity/less AM/AM distortion) at relatively lower power levels and relatively less correction (worse EVM operation and less linearity/more AM/AM distortion) at relatively higher power levels, thereby achieving a desirable balance of 1) better EVM at lower power levels, where OOB emissions have a relatively less significant impact on performance compared to EVM, and where EVM is relatively more important because of the lower transmission power, and 2) improved/reduced OOB emissions but degraded EVM at relatively higher power levels, where OOB emissions have a relatively more significant impact on performance as compared to EVM, and where EVM is less critical because of the higher transmission power.

In some embodiments, the control circuit 77 adjusts the bias in response to a power amplifier operating mode. For example, the control circuit 77 can cause the bias circuit 76 to output a first bias value in response to the power amplifier 32 being in a first operating mode, a second bias value in response to the power amplifier 32 being in a second operating mode, a third bias value in response to the power amplifier 32 being in a third operating mode, and so on. For instance, the control circuit 77 controls the bias circuit 76 to output a first bias value in response to the power amplifier 32 being in a high power mode, and output a second bias value in response to the power amplifier 32 being in a low power mode. As one example, the first operating mode can be a high power MSC0 mode where the power amplifier 32 operates at 26 dBm, the second operating mode can be a low power MSC11 mode where the power amplifier operates at 22 dBm, the first bias value can cause the power amplifier 32 to operate according to a gain compression curve corresponding to or similar to a relatively more distortive profile, similar to a Rapp model P value of 3, and the second bias value can cause the power amplifier 32 to operate according to a gain compression curve corresponding to or similar to a relatively more linear Rapp model P value of 6.5. FIG. 9AA shows EVM versus output power for P=3 and P=6.5. As shown, for P=3, where the power amplifier 32 is operating in MSC0 mode at 26 dBm, the system 60 is not as sensitive to EVM, and EVM performance of the power amplifier 32 is relatively comparable to P=6.5. On the other hand, for P=6.5, where the power amplifier 32 is operating in MSC11 mode at 22 dBm, and the system 60 is relatively more sensitive to EVM due to the lower power level, the power amplifier 32 has substantially improved EVM performance as compared to MSC10. Moreover, with less distortion, the power amplifier 32 can deliver high MSC11 power with 45 dBm, and can deliver power 2 dB higher than for a power amplifier operating similar to P=3 at 22 dBm, due to the improved linearity. FIG. 9AB shows OOB noise versus frequency offset from band edge for P=3 and P=6.5 for MSC0 high power mode (26 dBm). As indicated, because the power amplifier 32 in the high power MSC0 mode is operating similar to P=3 Rapp model curve, the power amplifier 32 has significantly improved OOB noise performance. For instance, the power amplifier 32 has 11 dB improved OOB noise as compared to P=6.5. The improved noise performance margin relaxes the burden on filtering or antenna isolation during simultaneous dual band operation. FIG. 9AC shows OOB noise versus frequency offset from band edge for P=3 and P=6.5 for MSC11 low power mode (22 dBm). As indicated, the power amplifier 32 operating similar to a P=6.5 Rapp model experiences relatively low emissions, comparable to the P=3 curve while operating at the relatively lower power level. The power amplifier 32 can therefore achieve relatively good OOB noise performance at 130 dBM/Hz even while operating at the more aggressive linearity correction of P=6.5 due to the lower output power.

In other embodiments, the control circuit 77 adjusts the bias in response to detected power levels instead of or in addition to operating mode. For instance, the control circuit 77 can adjust the bias in response to a number of detected power output level break points or thresholds, where the control circuit 77 causes the bias to adjust to a first level in response to a first threshold condition, to a second level in response to a second threshold condition, to a third level in response to a third threshold condition, etc., or continually adjusts in response to changes in power level.

FIG. 9AD shows a plot of EVM versus output power for an example power amplifier system 60. The solid line shows P values for an example power amplifier system 60 configured to maintain OOB noise at −130 dBm/Hz and 450 MHz offset at various output power levels, such as where the power amplifier 32 is configured to operate according to an output profile similar to or corresponding to the Rapp model at the listed P values. According to some embodiments, the control circuit 77 adjusts the bias from a first value to a second value in response to the detected power level reaching or exceeding 24 dBm, and adjusts the bias from the second value to the first value in response to the detected power level falling from above 24 dBm back down to 24 dBm or below. The first bias value sets the power amplifier 32 to operate according to or similar to the Rapp model at a P value of 6.5 or 5, for example, whereas the second bias value sets the power amplifier 32 to operate according to or similar to the Rapp model at a P value of 5 or 3. In some other embodiments, the control circuit 77 adjusts the bias from a first value to a second value in response to the detected power level reaching or exceeding 24 dBm, adjusts the bias from the second value to the first value in response to the detected power level falling back down to 24 dB or below, adjusts the bias from the second value to a third value in response to the detected power reaching or exceeding 25 dBm, and adjusts the bias value from the third value to the second value in response to the detected power falling back down to 25 dBM or below. In one embodiment, the first bias value sets the power amplifier 32 to operate according to or similar to the Rapp model at a P value of 6.5, the second bias value sets the power amplifier 32 to operate according to or similar to the Rapp model at a P value of 5, and the third bias value sets the power amplifier to operate according to or similar to the Rapp model at a P value of 3. In yet further embodiments, the control circuit 77 continually adjusts the bias in response to changes in detected output power instead of doing so at discrete break points or thresholds.

Referring still to FIG. 9AD, the dashed line shows EVM versus output power for the same power levels as for the power amplifier 32 output profile represented by solid line, but for a perfectly linear Rapp model amplifier (e.g., P=100). As shown, the power amplifier 32 can, as compared to the perfectly linear amplifier, achieve improved OOB noise performance at higher output power levels. In one embodiment, the power amplifier 32 achieves 19 dB better performance at 26 dBm output power, 15 dB better performance at 25 dBm, and 8.5 dB better performance at 24 dBm, while maintaining sufficient although degraded EVM performance. For example, while the power amplifier 32*s* (solid line) has somewhat reduced EVM performance at higher power levels (e.g., 24, 25, 26 dBm and above), the EVM performance is satisfactory given the reduced sensitivity to EVM at higher power levels, and achieves an acceptable trade off given the improved OOB performance.

Instead of, or in addition to, adjusting the bias, the system 60 can achieve the power amplifier response curve via digital pre-distortion (DPD). DPD can be used to linearize a signal that is being transmitted via the power amplifier system 60 by way of applying pre-distortion to the input transmit signal prior to amplification. For example, nonlinearity from one of the power amplifiers 32 and/or other components of an RF system along the transmit signal paths can lead to in-band distortion, which can be quantified by EVM, which is a direct measurement of modulation accuracy and transmitter performance that captures an error vector between a measured signal and its corresponding ideal point in a signal constellation, such as for example a 16 quadrature amplitude modulation (QAM) constellation. Using DPD can provide a flexible and robust mechanism for enhancing performance of a wide variety of communication systems, including modern ultra-wideband communication systems.

Figure 9B:
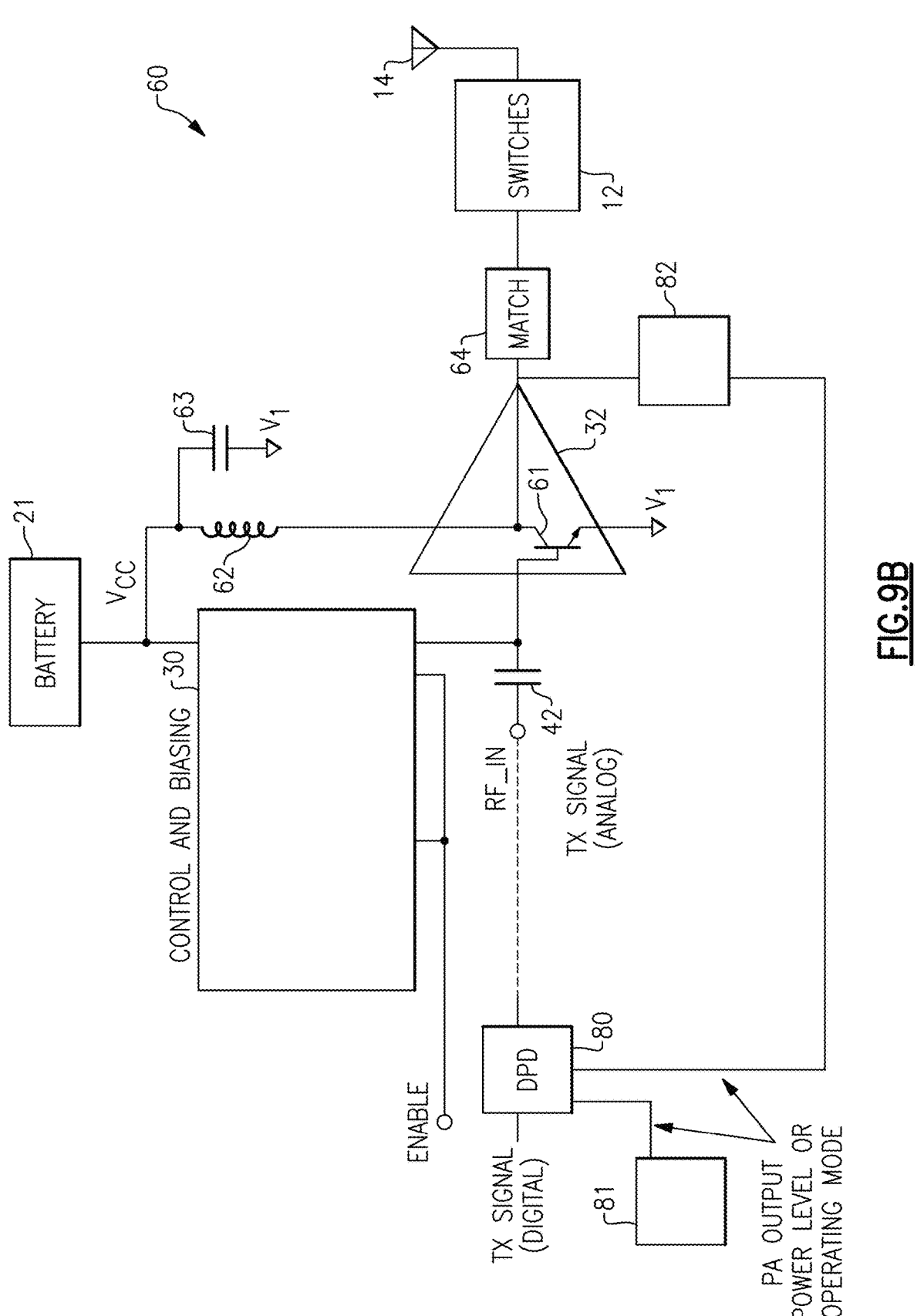
FIG. 9B is a schematic block diagram of a power amplifier system configured to adjust an amount of pre-distortion based on a power amplifier operating mode or power level.

FIG. 9B is a schematic block diagram of a power amplifier system 60 configured to adjust an amount of pre-distortion based on a power amplifier operating mode or power level. The power amplifier system 60 includes a DPD module 80, which can be implemented on the baseband processor (e.g., processor 34 of FIG. 3) or another processor, depending on the embodiment, performs digital signal processing to pre-distortion the digital transmit signal. The DPD module 80 outputs a pre-distorted version of the transmit signal, which undergoes additional processing as indicated by the dashed line, such as conversion to analog by one or more analog to digital converters and/or other additional processing before being provided to the power amplifier 32 as RF_IN. The DPD module 80 can additionally perform adaptive pre-distortion, e.g., by adapting one or more DPD coefficients based on the detected output power amplifier output signal. The digital transmit data can be, for example, digital in-phase (I) and quadrature-phase (Q) signals that are subsequently converted to analog I and Q signals and modulated using an I/Q modulator to generate the RF signal for transmission. The pre-distortion provided by the DPD 80 can control the linearity of the power amplifier 32 to achieve the desired balance of EVM and OOB performance, as described herein, similar to the bias control described above. For example, a baseband processor (e.g., the baseband processor 34 shown in FIG. 3) can generate a transmit signal (which can be represented in an I/Q format), which is pre-distorted, upconverted by a transceiver (e.g., the transceiver 13 shown in FIG. 2), and subsequently amplified by the power amplifier 32.

Similar to the control circuit 77 of FIG. 9A, the DPD module 80 can adjust the pre-distortion in response to a power amplifier operating mode or detected power level. For instance, the detector 82 can be configured detect a power level or operating mode of the power amplifier 32, and provide a first signal indicative of the power level or operating mode to the DPD module 80. Or the control component 81 can be configured to provide the DPD module 80 a second signal indicating a power operating mode or detected or estimated power amplifier power level. Based on the first or second signal, the DPD module 80 can apply a prescribed amount of digital pre-distortion such that the output signal of the power amplifier 32 has a desired amount of AM/AM distortion correction, e.g., to provide relatively more distortion correction (better EVM operation and more linearity/less AM/AM distortion) at relatively lower power levels and relatively less distortion correction (worse EVM operation and less linearity/more AM/AM distortion) at relatively higher power levels, thereby achieving the above-described desirable balance of 1) better EVM at lower power levels, where OOB emissions have a relatively less significant impact on performance compared to EVM, and where the system is more sensitive to EVM, and 2) improved/reduced OOB emissions but degraded EVM at relatively higher power levels, where OOB emissions have a relatively more significant impact on performance as compared to EVM, and where the system is less sensitive to EVM.

In some embodiments, the DPD module 80 adjusts the pre-distortion in response to a power amplifier operating mode. For example, the control circuit 77 can apply a first pre-distortion curve in response to the power amplifier 32 being in a first operating mode, a second pre-distortion curve in response to the power amplifier 32 being in a second operating mode, a third pre-distortion curve in response to the power amplifier 32 being in a third operating mode, and so on. For instance, the DPD module 80 can apply a first pre-distortion corresponding to a relatively low linearity mode (e.g., minimal or relatively low non-linearity correction) in response the power amplifier 32 being in a high power mode, and a second pre-distortion corresponding to a relatively high linearity mode (e.g., full or relatively high non-linearity correction) in response to the power amplifier 32 being in a low power mode. For instance, the first operating mode can be a high power MSC0 mode where the power amplifier 32 operates at 26 dBm, and the second operating mode can be a low power MSC11 mode where the power amplifier operates at 22 dBm.

In other embodiments, the DPD module 80 adjusts the applied pre-distortion in response to detected power levels instead of or in addition to the operating mode. For instance, the DPD module 80 can adjust the pre-distortion in response to a number of detected power output level break points or thresholds, where the DPD module 80 adjusts to a first pre-distortion in response to a first threshold condition, to a second pre-distortion in response to a second threshold condition, to a third pre-distortion in response to a third threshold condition, etc. According to some embodiments, the DPD module 80 adjusts from a first pre-distortion (e.g., most linear) to a second pre-distortion (e.g., least linear) in response to the detected power level reaching or exceeding 24 dBm, and adjusts from the second pre-distortion to the first pre-distortion in response to the detected power level falling from above 24 dBm back down to 24 dBm or below. In some other embodiments, the DPD module 80 adjusts the pre-distortion from a first pre-distortion (e.g., most linear) to a second pre-distortion (intermediate linearity) in response to the detected power level reaching or exceeding 24 dBm, adjusts the pre-distortion from the second pre-distortion to the first pre-distortion in response to the detected power level falling back down to 24 dB or below, adjusts the pre-distortion from the second pre-distortion to a third pre-distortion (least linear) in response to the detected power reaching or exceeding 25 dBm, and adjusts the pre-distortion value from the third value to the second value in response to the detected power falling back down to 25 dBm or below. In yet further embodiments, the control circuit 77 continually adjusts the bias in response to changes in detected output power instead of doing so at discrete break points or thresholds.

Figure 9C:
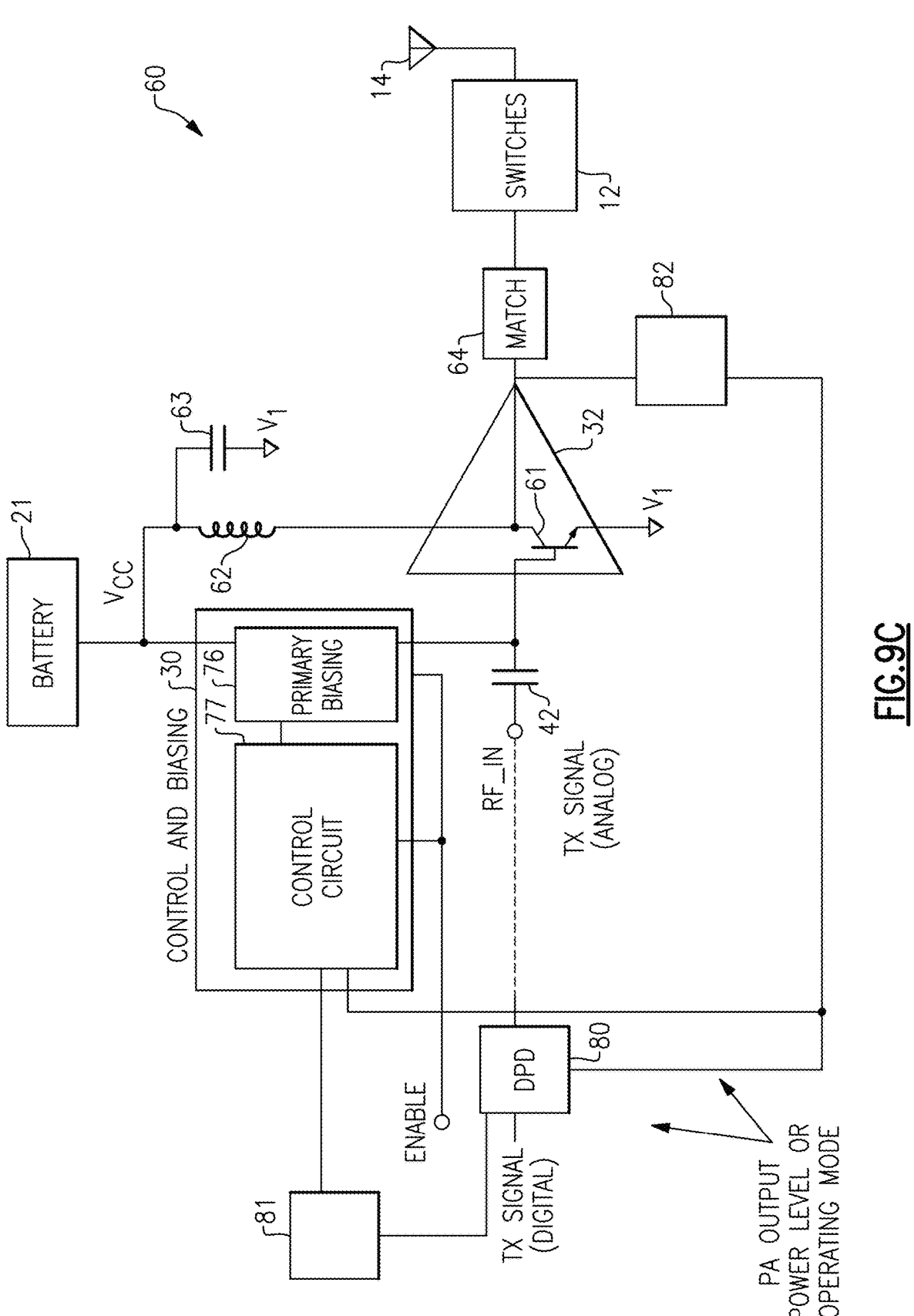
FIG. 9C is a schematic block diagram of a power amplifier system configured to adjust power amplifier bias and/or pre-distortion based on a power amplifier operating mode or power level.

In some embodiments, the system 60 implements a combination of power amplifier 32 bias adjustment and DPD adjustment to achieve the desired performance. For example, as shown in FIG. 9C, both the control circuit 77 and DPD module 80 can be responsive to detected power amplifier output level or power amplifier operating mode to adjust the bias and digital pre-distortion. Moreover, while linearity control in the embodiments illustrated in FIGS. 9A, 9B, 9C, 9D, and 9E is implemented by one or more of the control circuit 77, DPD module 80, and control component 81, depending on the embodiment, in some embodiments, the control is consolidated into a single component that, for example, commands the control and biasing circuit 30, DPD module 80, or other entities to adjust the operation of the power amplifier 32.

Figure 9D:
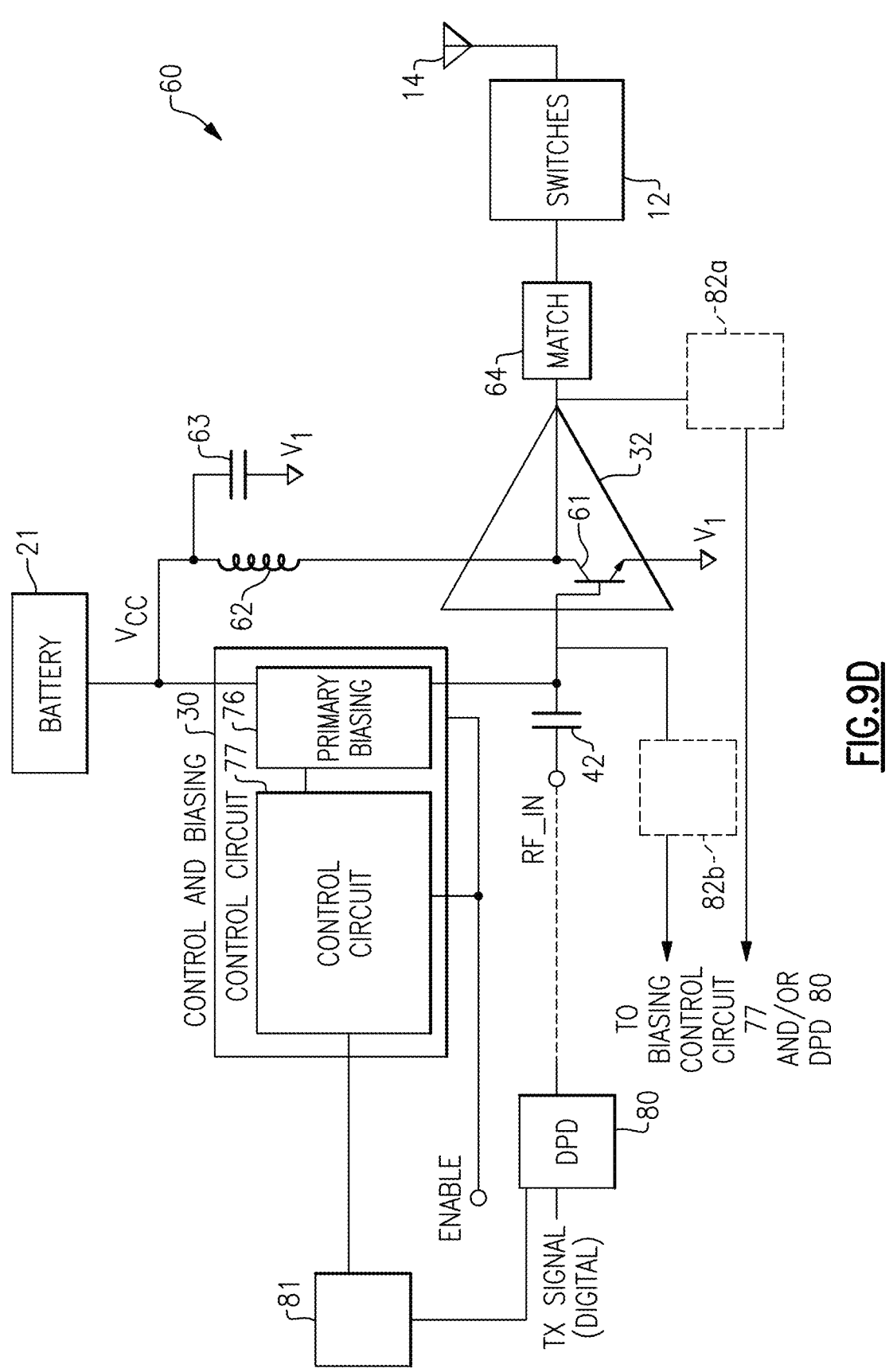
FIG. 9D is a schematic block diagram of a power amplifier system configured to adjust power amplifier bias and/or pre-distortion based on a power amplifier operating mode or power level. The power level can be detected at an input and/or an output of the amplifier, depending on the embodiment.

As shown in FIG. 9D, a detector 82b can be placed at the input of the power amplifier 32 in order to detect an input power level instead of, or in addition to the detectors 82a at the output of the power amplifier 32. The input power level can be used as a proxy or estimate for the output power level, for example. The control circuit 77 and/or the DPD module 80 can respond to the RF input power levels detected by the input detector 82b (or to estimated output power levels calculated in response to the detected RF input power levels) in any of the manners described above with respect to the output power levels, such as to generally respond to lower detected input power levels to bias the power amplifier 32 to behave relatively more linearly or to apply more relatively more DPD correction, and to respond to generally respond to higher detected power levels to bias the power amplifier 32 to behave relatively less linearly or to apply relatively less DPD correction.

Figure 9E:
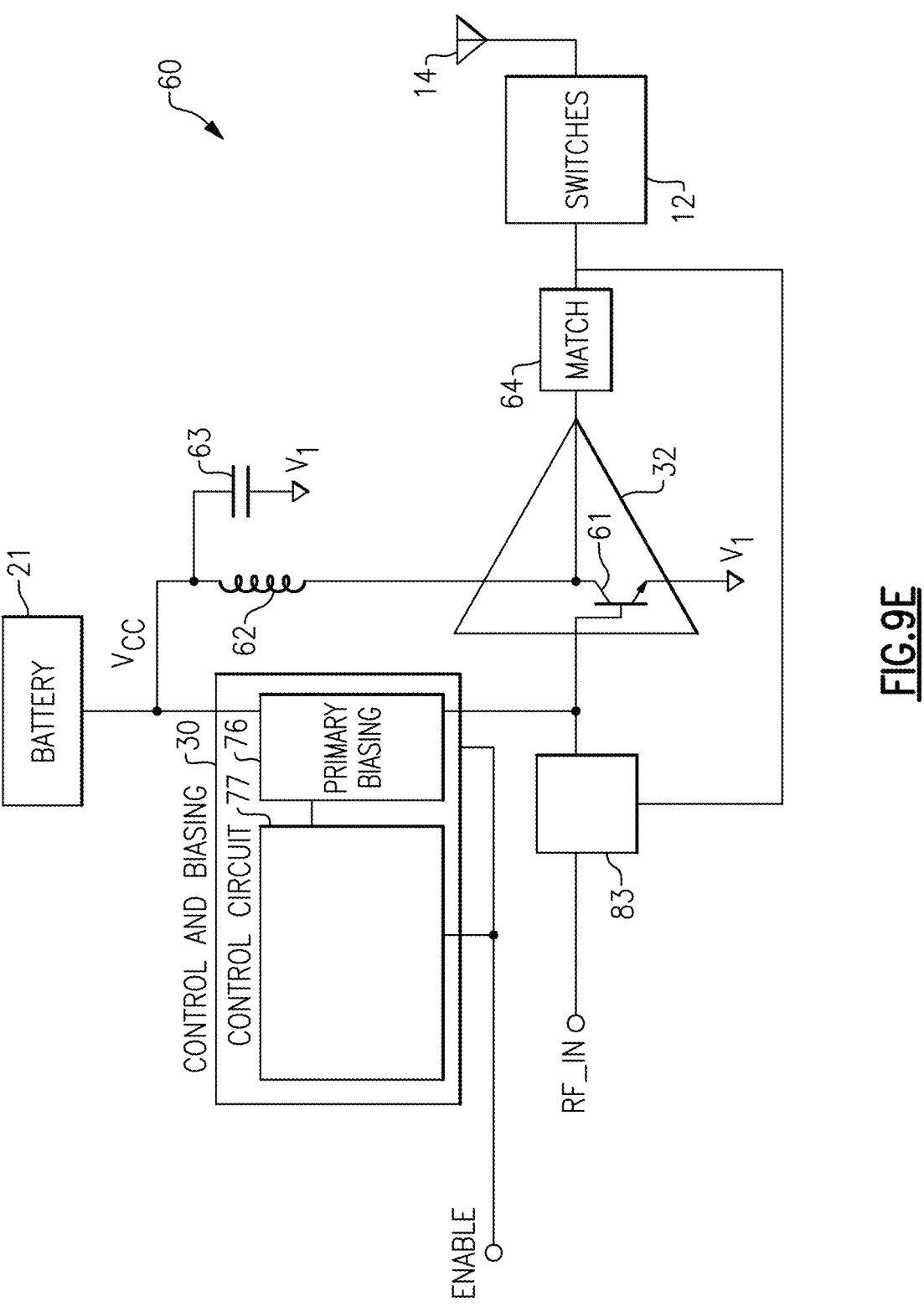
FIG. 9E is a schematic block diagram of a power amplifier system having a gain compression circuit configured to adjust power amplifier operation based on power amplifier power level.
Figure 9F:
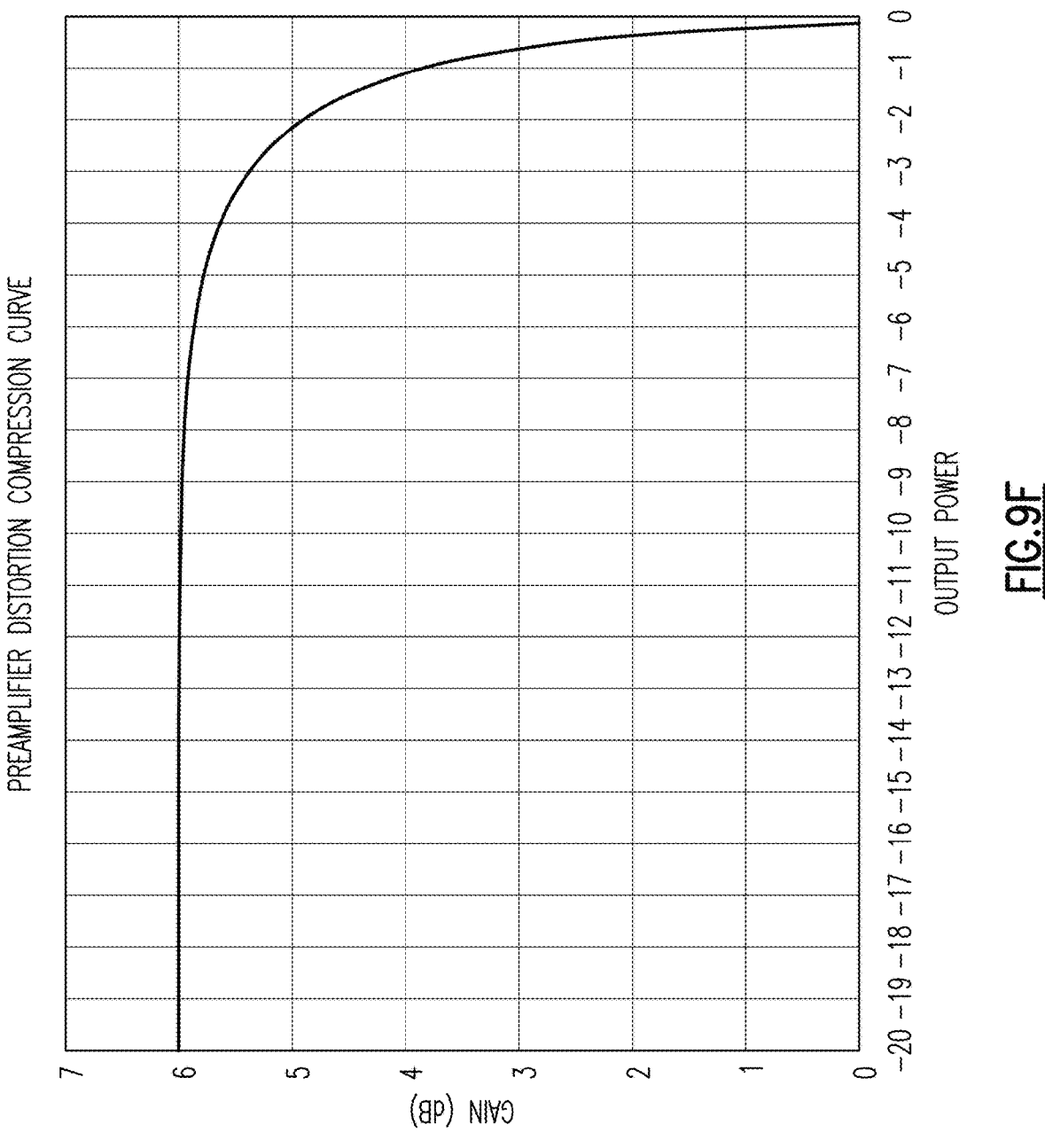
FIG. 9F is a gain compression curve applied by a gain compression circuit of a power amplifier system such the one of FIG. 9E.

FIG. 9E illustrates a schematic block of another example of a power amplifier system 60, which includes a gain compression circuit 83 positioned at the input of the power amplifier 32. The compression circuit 83 can be used instead of or in addition the control circuit 77 and/or DPD module 80 to adjust the performance of the power amplifier 32. In some embodiments, the gain compression circuit 83 can be configured as a pre-amplifier to impart a gain compression, so as to achieve a desired compression characteristic by the overall amplifier. For example, the analog circuit 83 can impart no or relatively little compression at low powers, and increasing compression/distortion at high powers in order to achieve a prescribed gain compression characteristic. FIG. 9F is a chart showing one example of a gain compression curve that can be achieved by the system 60 of FIG. 9E, where the gain compression circuit 83 comprises a pre-amplifier with little distortion at low powers and increasing compression at higher powers.

In certain embodiments, the power amplifier system 60 is configured to adjust the operation of the power amplifier 32 based on the power level or operating mode during a pre-determined window or time period. For example, in one embodiment, the power amplifier system 60 is configured to determine an operating mode of the power amplifier 32 during transmission of a legacy long training field (L-LTF) symbol(s) specified by an 802.11 communication protocol. Depending on the operating mode (e.g., MSC0 low power or MSC11 high power mode), the power amplifier system 60 can adjust operation accordingly. For example, the control circuit 77 can cause the bias circuit 76 to adjust the bias of the power amplifier 32 and/or the DPD module 80 can adjust pre-distortion as discussed herein. In such cases, the power amplifier 32 can be fully settled by the start of the high efficiency training field (HE-LTF), e.g., which can be about 35 microseconds later. In various embodiments, the power amplifier can be fully settled within 15, 20, 25, 30, 35, 40, 45, 50, 55, or 60 microseconds.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency front end system comprising:
a first communication path including a power amplifier configured to amplify a radio frequency transmit signal in a first communication band for transmission via a first antenna;
a second communication path including a receive amplifier, the second communication path configured to receive signals in a second communication band via a second antenna simultaneously with transmission in the first communication band by the first communication path; and
a controller configured to control the power amplifier based on one or both of an operating mode of the power amplifier and a power level of the power amplifier, to operate according to a first output profile at a first power level, and to operate according to a second output profile at a second power level, the first power level lower than the second power level, and there being reduced out of band noise incident on the second communication path from the first communication path at the second power level according to the second output profile as compared to the first output profile at the second power level, despite the first output profile corresponding to higher linearity and lower error vector magnitude than the second output profile.

2. The radio frequency front end system of claim 1 wherein the controller is configured to adjust a bias of the power amplifier to cause the power amplifier to switch between operating according to the first and second output profiles.

3. The radio frequency front end system of claim 1 wherein the controller is configured to adjust a pre-distortion to cause the power amplifier to switch between operating according to the first and second output profiles.

4. The radio frequency front end system of claim 3 further comprising a digital pre-distortion module residing on a processor, the controller configured to control the digital pre-distortion module to adjust the pre-distortion.

5. The radio frequency front end system of claim 1 wherein the controller is configured to control the power amplifier to operate according to the first output profile in response to the power amplifier operating in a first lower power operating mode and to operate according to the second output profile in response to the power amplifier operating in a second higher power operating mode.

6. The radio frequency front end system of claim 1 wherein the controller is configured to determine an operating mode or power level of the power amplifier during a pre-determined period corresponding to transmission of one or more training symbols defined by a wireless communication standard.

7. The radio frequency front end system of claim 1 wherein the first output profile corresponds to a first Rapp model "P" value, and the second output profile corresponds to a second Rapp model "P" value lower than the first Rapp model "P" value.

8. The radio frequency front end system of claim 1 further comprising a gain compression circuit configured to apply increasing distortion to the power amplifier with increasing power amplifier output power.

9. The radio frequency front end system of claim 1 further comprising a detector configured to detect a power level of the power amplifier.

10. An access point, base station, or mobile device comprising the radio frequency front end system of claim 1.

11. A radio frequency system comprising:
a transmit path including a power amplifier configured to amplify a radio frequency transmit signal for transmission in a first communication band via a first antenna;
a receive path including a low noise amplifier, the receive path configured to receive signals in a second communication band via a second antenna;
a controller configured to control the power amplifier based on one or both of an operating mode of the power amplifier and a power level of the power amplifier, to operate according to a first output profile at a first power level, and to operate according to a second output profile at a second power level, the first power level lower than the second power level, and there being reduced out of band noise incident on the second communication path from the transmit path at the second power level according to the second output profile as compared to the first output profile at the second power level, despite the first output profile corresponding to higher linearity and lower error vector magnitude than the second output profile; and
a baseband processor.

12. The radio frequency system of claim 11 wherein the controller is configured to adjust a bias of the power amplifier to cause the power amplifier to switch between operating according to the first and second output profiles.

13. The radio frequency system of claim 11 wherein the controller is configured to adjust a pre-distortion to cause the power amplifier to switch between operating according to the first and second output profiles.

14. The radio frequency system of claim 13 further comprising a digital pre-distortion module residing on a processor, the controller configured to control the pre-distortion module to adjust the pre-distortion.

15. The radio frequency system of claim 11 wherein the controller is configured to control the power amplifier to operate according to the first output profile in response to the power amplifier operating in a first lower power operating mode and to operate according to the second output profile in response to the power amplifier operating in a second higher power operating mode.

16. The radio frequency system of claim 11 wherein the controller is configured to determine an operating mode or power level of the power amplifier during a pre-determined period corresponding to transmission of one or more training symbols defined by a wireless communication standard.

17. The radio frequency system of claim 11 wherein the first output profile corresponds to a first Rapp model "P"

value, and the second output profile corresponds to a second Rapp model "P" value lower than the first Rapp model "P" value.

18. The radio frequency system of claim 11 further comprising a gain compression circuit configured to apply increasing distortion to the power amplifier with increasing power amplifier output power.

19. The radio frequency system of claim 11 wherein the baseband processor implements at least a portion of the controller.

20. A mobile device comprising:
a first antenna and a second antenna;
a first communication path including a power amplifier configured to amplify a radio frequency transmit signal for transmission in a first communication band via the first antenna;
a second communication path including a receive amplifier, the second communication path configured to receive signals in a second communication band simultaneously with transmission in the first communication band by the first communication path;
a controller configured to control the power amplifier based on one or both of an operating mode of the power amplifier and a power level of the power amplifier, to operate according to a first output profile at a first power level, and to operate according to a second output profile at a second power level, the first power level lower than the second power level, and there being reduced out of band noise incident on the second communication path from the first communication path at the second power level according to the second output profile as compared to the first output profile at the second power level, despite the first output profile corresponding to higher linearity and lower error vector magnitude than the second output profile; and
a baseband processor.

* * * * *